US006657761B2

United States Patent
Suzuki et al.

(10) Patent No.: US 6,657,761 B2
(45) Date of Patent: Dec. 2, 2003

(54) OPTICAL SCANNING DEVICE, IMAGE FORMING APPARATUS, AND OPTICAL SCANNING METHOD

(75) Inventors: Seizo Suzuki, Yokohama (JP); Kenichi Takanashi, Inzai (JP)

(73) Assignee: Ricoh Company, Ltd., Tokyo (JP)

( * ) Notice: Subject to any disclaimer, the term of this patent is extended or adjusted under 35 U.S.C. 154(b) by 53 days.

(21) Appl. No.: 09/816,378

(22) Filed: Mar. 26, 2001

(65) Prior Publication Data

US 2001/0026393 A1 Oct. 4, 2001

(30) Foreign Application Priority Data

Mar. 27, 2000 (JP) ........................................ 2000-087394

(51) Int. Cl.$^7$ .............................................. G02B 26/08
(52) U.S. Cl. ...................................................... 359/205
(58) Field of Search ................................ 359/205, 196, 359/212, 216; 347/241, 242, 243, 244

(56) References Cited

U.S. PATENT DOCUMENTS

| 4,836,630 | A | | 6/1989 | Takanashi | |
|---|---|---|---|---|---|
| 5,701,191 | A | * | 12/1997 | Iwasaki | ...................... 359/205 |
| 5,757,532 | A | | 5/1998 | Takanashi | |
| 5,995,268 | A | * | 11/1999 | Shiraishi et al. | ............ 347/243 |
| 6,104,522 | A | | 8/2000 | Hayashi et al. | |

* cited by examiner

Primary Examiner—Euncha Cherry
(74) Attorney, Agent, or Firm—Oblon, Spivak, McClelland, Maier & Neustadt, P.C.

(57) ABSTRACT

An optical scanning device condenses a beam deflected by a light deflector, by a scanning and imaging lens toward a surface to be scanned to form a beam spot thereon, and scans the surface to be scanned by the beam spot. At least one lens of the scanning and imaging lens is configured so that a lens body thereof is held by a holding frame, wherein a rib surface at an end in a longitudinal direction of the holding frame is inclined so that a ghost light generated as a result of the deflected beam being reflected by the end in the longitudinal direction of the holding frame is changed in light path in a sub-scan direction.

6 Claims, 7 Drawing Sheets

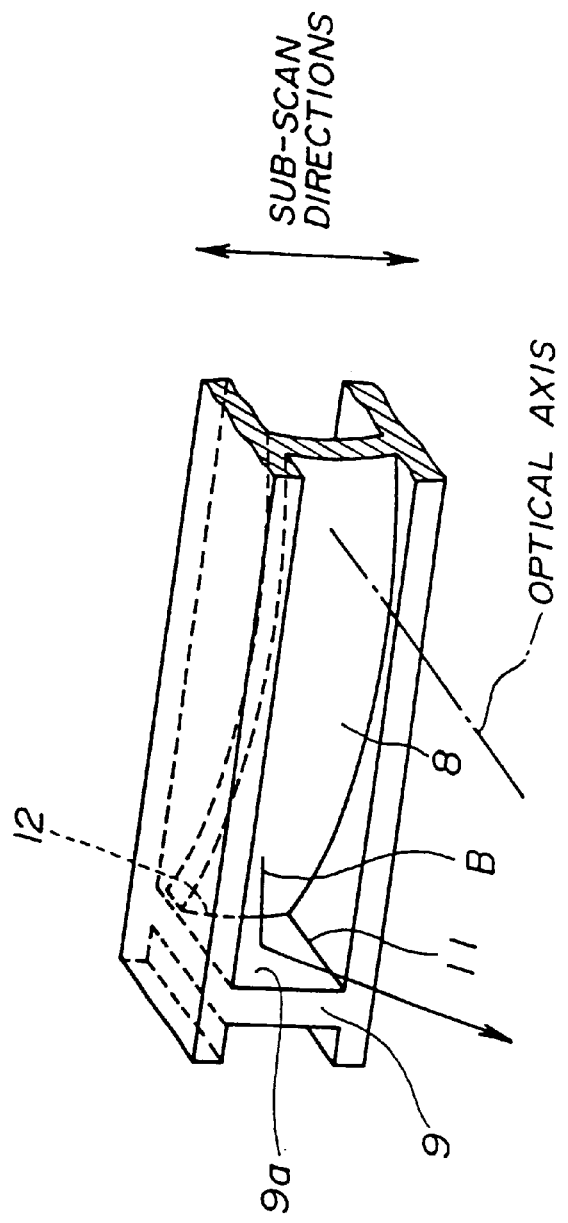

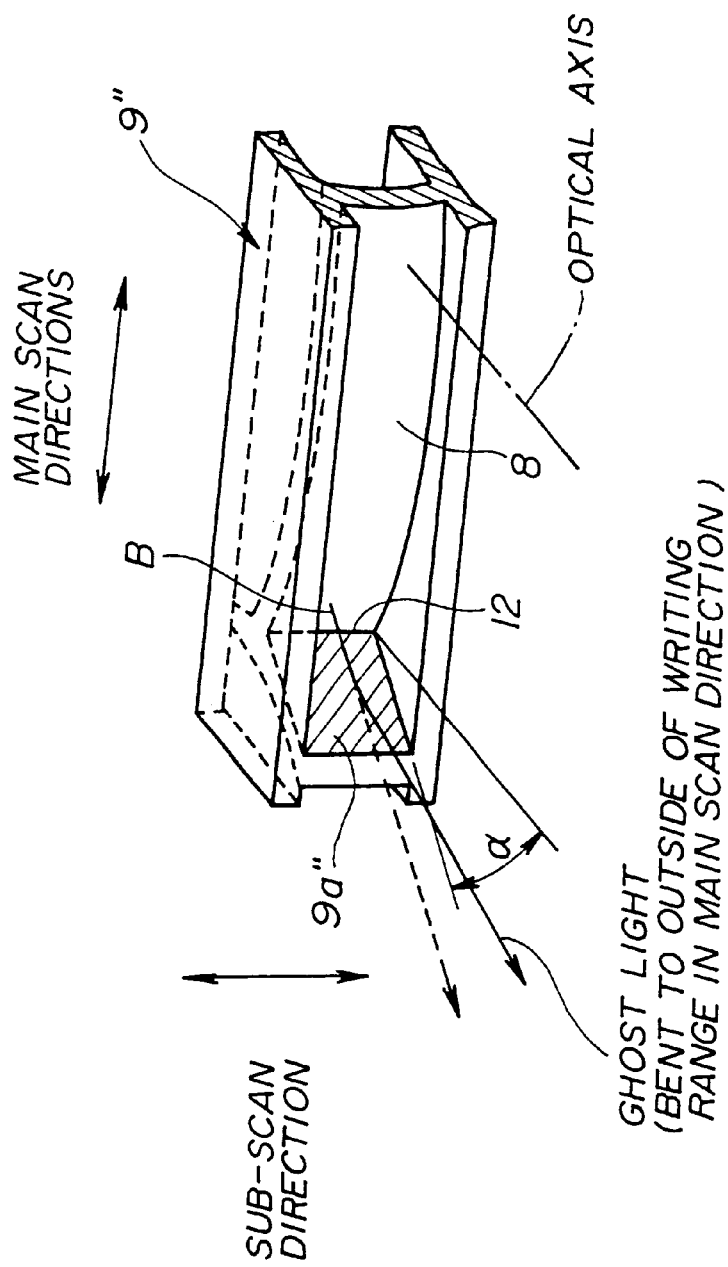

OPTICAL SCANNING DEVICE, IMAGE FORMING APPARATUS, AND OPTICAL SCANNING METHOD

BACKGROUND OF THE INVENTION

1. Field of the Invention

The present invention generally relates to an optical scanning device, an image forming apparatus and an optical scanning method, and, in particular, to improvements in an optical scanning device acting as a writing optical system of an electrophotographic image forming apparatus such as a copier, a printer, a facsimile machine, or the like.

2. Description of the Related Art

A digital image forming apparatus includes an optical scanning device. In the apparatus, a laser light emitted from the optical scanning device is applied onto a photosensitive body so that an electrostatic latent image is formed thereon, the electrostatic latent image is developed by a developing device by using toner, and the thus-obtained toner image is transferred and fixed onto a transfer paper. Thereby, image formation is rendered. The optical scanning device is a device which produces the laser light based on an electric image signal obtained from conversion from optical image data such as that of a reflected beam obtained from reading and scanning operation performed by a reading optical system, and emits the produced laser light onto the photosensitive body.

FIG. 1A shows a plan view of an optical scanning device (laser writing device) in the related art, FIG. 1B shows a configuration of an essential part thereof, and FIG. 1C shows a perspective view of an essential part thereof.

In FIGS. 1A and 1B, a beam emitted by an LD unit 1 is condensed in sub-scan directions (directions perpendicular to FIG. 1A) by a cylindrical lens 2. The condensed beam is used to image a latent image long along a main scan direction on or in the vicinity of a deflection reflective surface 4 of a polygon mirror after passing through a transparent parallel plate 3 provided on a window of a housing, not shown in the figure, tightly enclosing the polygon mirror (light deflector) 5.

A reflected beam (deflected beam) from the deflection reflective surface 4 passes through the parallel plate 3, is incident on a lens system part 6 (lens 6' and lens 6") having an fθ function and a long-dimensional lens 8, respectively, and, then, is condensed toward a surface of a photosensitive body (surface to be scanned) 7. The lens system part 6 (lens 6' and lens 6") having the fθ function and long-dimensional lens 8 act as a scanning and imaging lens.

Recently, high density image formation has been demanded. Accordingly, reduction of diameter of a beam spot formed on the surface to be scanned 7 is strongly demanded. For this purpose, complex shapes such as aspherical surfaces, special toroidal surfaces and so forth have been employed in the fθ lens system part (lenses 6' and 6") and long-dimensional lens 8 of the scanning and imaging lens, and these lenses have been made of plastic through resin molding technique in many cases.

A lens made of plastic (referred simply to as 'plastic-made lens', hereinafter) has its rigidity increased as a result of a lens body thereof (long-dimensional lens 8) being supported by a holding frame (rib) 9, and, thereby, deformation thereof due to time elapsing is avoided. Specifically, manufacture is made such that the holding frame 9 is formed integrally with the long-dimensional lens 8 so as to enclose the four sides of the lens 8. As shown in FIGS. 1B and 1C, rib surfaces 9a which are parallel to sub-scan directions of the long-dimensional lens 8 are formed on the inner surfaces at both ends in the longitudinal directions of the holding frame 9.

The holding frame 9 is provided outside of an effective diameter (a range of the lens surface corresponding to the range through which a proper image is written on the photosensitive body which is an effective image display device writing region/range). However, the beam needs to be made to pass through the lens even outside of the effective diameter for the purpose of synchronization of each scan line. Specifically, a synchronization detecting sensor, not shown in the figure, is provided outside of the effective diameter in a main scan direction, and, thereby, a first scanning point of the deflected beam and scanning speed (time) are detected.

At this time, as also shown in FIG. 1B, the beam B applied to the outside of the effective diameter is reflected by the rib surface 9a so as to become a ghost light, is then applied to the surface to be scanned 7, and, as a result, an abnormal image may formed thereon. This is because, as the rib surfaces 9a, in the related art, are surfaces parallel to the sub-scan directions of the long-dimensional lens 8, the ghost light therefrom is applied to the surface to be scanned 7 within an effective image region thereof when the beam B applied to the outside of the effective diameter is reflected by the rib surface 9a, and, thereby, an abnormal image is formed on the surface to be scanned 7, in many cases.

SUMMARY OF THE INVENTION

The present invention has been devised in view of the above-mentioned problem, and an object of the present invention is to prevent the ghost light generated due to reflection by the rib surface of the holding frame from adversely affecting the proper image formation onto the surface to be scanned so as to render a satisfactory proper image.

According to the present invention, in an optical scanning device including a plastic-made scanning and imaging lens reinforced by a holding frame, a ghost light generated as a result of a beam deflected by a light deflector and applied to the outside of an effective diameter of the scanning and imaging lens being reflected by a rib surface of the holding frame is prevented from adversely affecting proper image formation so that a satisfactory proper image can be rendered.

Specifically, in an optical scanning device, according to the present invention, condensing a beam deflected by a light deflector, by a scanning and imaging lens toward a surface to be scanned to form a beam spot thereon, and scanning the surface to be scanned by the beam spot, at least one lens of the scanning and imaging lens is configured so that a lens body thereof is held by a holding frame, wherein a rib surface at an end in a longitudinal direction of the holding frame is inclined so that a ghost light generated as a result of the deflected beam being reflected by the end in the longitudinal direction of the holding frame is changed in light path in a sub-scan direction.

The rib surface is inclined as a result of being rotated about an axis parallel to an optical axis of the lens body, for example.

Accordingly, it is possible to prevent the ghost light from being applied to the effective writing range of the surface to be scanned, and, to prevent any abnormal image formed therefrom from being formed. Specifically, the ghost light does not adversely affect proper image formation, and, as a result, a sufficient proper image can be rendered.

In an optical scanning device, according to another aspect of the present invention, condensing a beam deflected by a light deflector, by a scanning and imaging lens toward a surface to be scanned to form a beam spot thereon, and scanning the surface to be scanned by the beam spot, at least one lens of the scanning and imaging lens is configured so that a lens body thereof is held by a holding frame, wherein a rib surface at an end in a longitudinal direction of the holding frame is inclined so that a ghost light generated as a result of the deflected beam being reflected by the holding frame is turned outside of an effective writing range in a main scan direction.

The rib surface is inclined as a result of being rotated about an axis parallel to a sub-scan direction of the scanning and imaging lens, for example.

Accordingly, it is possible to prevent the ghost light from being applied to the effective writing range of the surface to be scanned, and, to prevent any abnormal image formed therefrom from being formed. Specifically, the ghost light does not adversely affect proper image formation, and, as a result, a sufficient proper image can be rendered.

In an optical scanning device, according to another aspect of the present invention, condensing a beam deflected by a light deflector, by a scanning and imaging lens toward a surface to be scanned to form a beam spot thereon, and scanning the surface to be scanned by the beam spot, at least one lens of the scanning and imaging lens is configured so that a lens body thereof is held by a holding frame, wherein a rib surface at an end in a longitudinal direction of the holding frame is curved so that a ghost light generated as a result of the deflected beam being reflected by the holding frame forms a beam spot sufficiently spread on the surface to be scanned.

Thereby, the beam spot formed on the surface to be scanned acting as the photosensitive body from the ghost light is sufficiently spread, has a low energy density, and, thus, does not result in substantial exposure of the photosensitive body. Accordingly, it is possible to render a sufficient proper image.

Any of the above-mentioned lens body and holding frame may be manufactured through integral molding of a plastic material. Accordingly, it is possible to achieve an inexpensive and high-rigidity scanning optical system including the scanning and imaging lens by which the ghost light generated from the rib surface of the holding frame does not adversely affect the proper image formation.

Other objects and further features of the present invention will become more apparent from the following detailed description when read in conjunction with the accompanying drawings.

BRIEF DESCRIPTION OF THE DRAWINGS

FIGS. 1A, 1B and 1C show a plan view of an optical scanning device (laser writing device) in the related art, a configuration of an essential part thereof and a perspective view of an essential part thereof, respectively;

FIGS. 3A, 3B and 3C show a perspective view of an essential part of a scanning and imaging lens in a second embodiment of the present invention, a magnified view of an essential part thereof and a plan view of an optical scanning device employing the scanning and imaging lens, respectively;

DETAILED DESCRIPTION OF THE PREFERRED EMBODIMENTS

Figure 2:
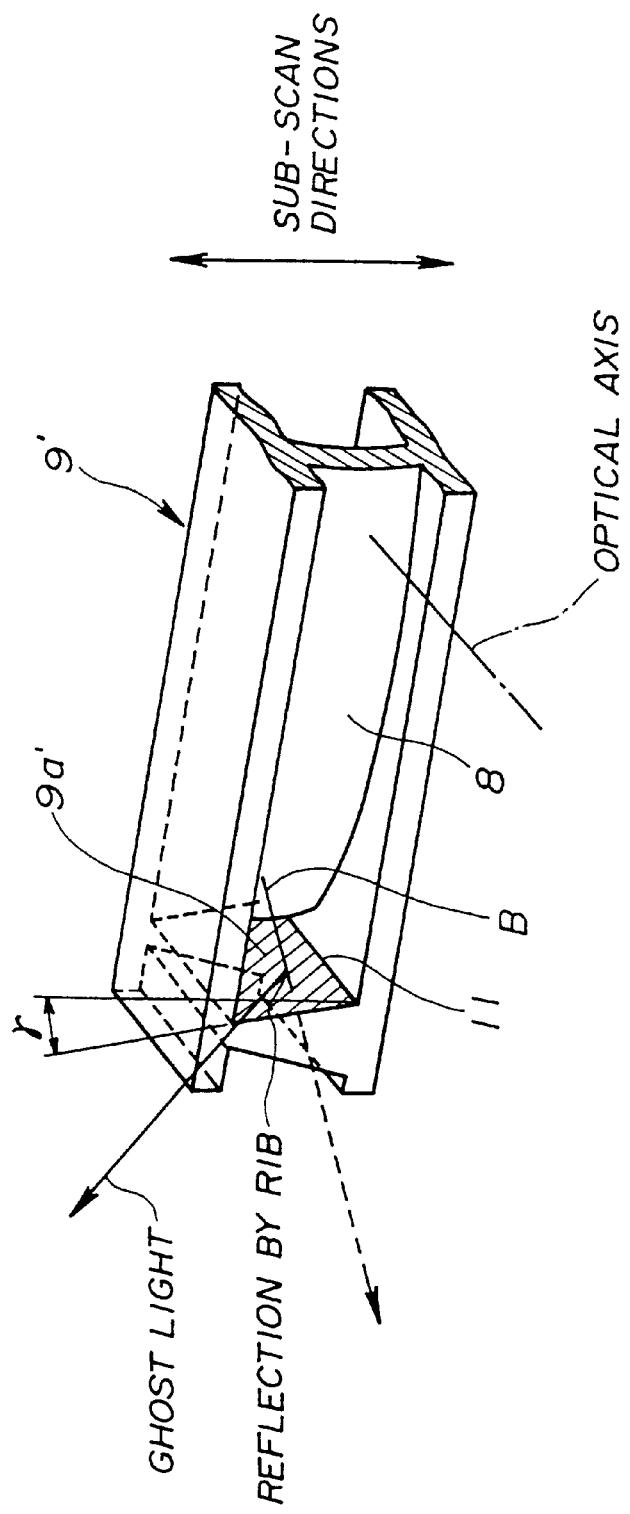
FIG. 2 shows a perspective view of an essential part of a holding frame of a plastic-made scanning and imaging lens in a first embodiment of the present invention.

FIG. 2 shows a perspective view of an essential part of a holding frame 9' of a plastic-made scanning and imaging lens in a first embodiment of the present invention.

Figure 1A:
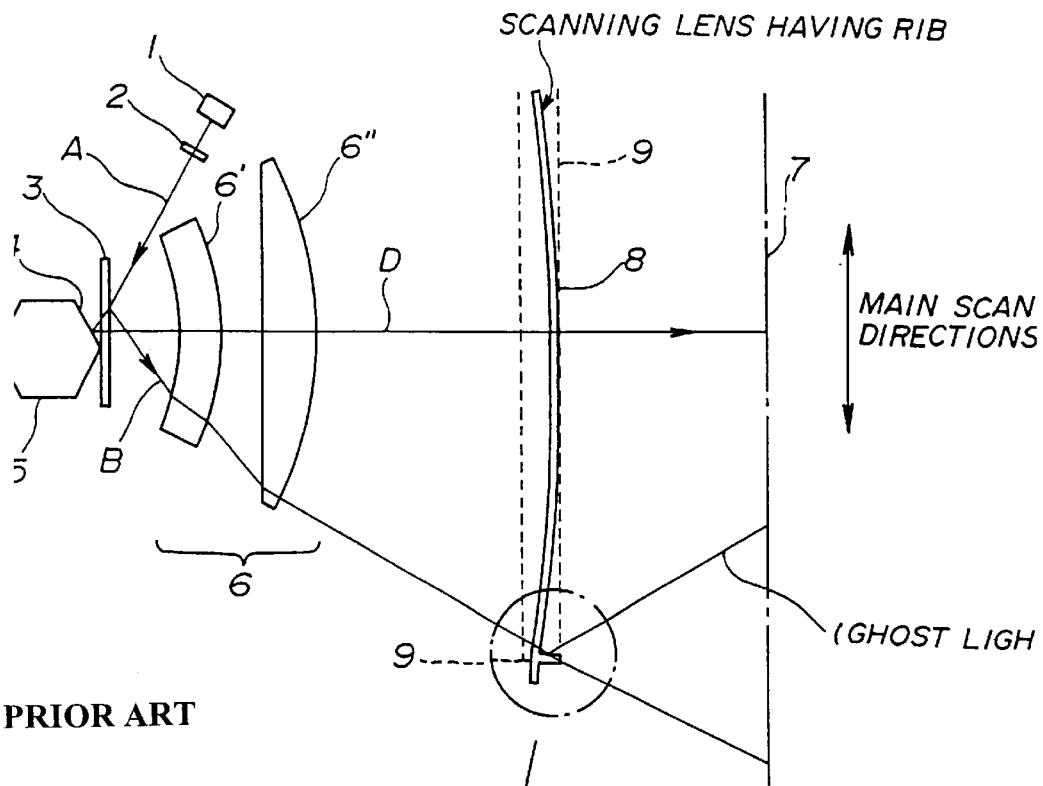

This scanning and imaging lens includes the long-dimensional lens 8 used in an optical scanning device such as that shown in FIG. 1A, for example, and the holding frame 9', made of the same material as that of the long-dimensional lens 8 and formed integrally with the long-dimensional lens 8. The holding frame 9' is integrated with the long-dimensional lens 8 so as to enclose the four sides of, that is, the entire periphery of the long-dimensional lens 8. Rib surfaces 9a' of the holding frame 9' provided on inner surfaces at both ends in the longitudinal directions of the holding frame 9' are inclined, as shown in the figure, so that the deflected beam applied outside of the effective diameter is reflected by respective one of the rib surfaces 9a', and thereby, a ghost light is generated, however, the light path of the ghost light is changed from that in the configuration of the holding frame 9 in the related art shown in FIGS. 1A, 1B and 1C.

Specifically, as shown in FIG. 2, each rib surface 9a' is a surface inclined/rotated outside by a necessary angle γ from the rib surface 9a shown in FIG. 1C about an axis parallel to the optical axis of the long-dimensional lens 8, for example, an axis along the bottom side 11 of the rib surface 9a shown in FIG. 1C. Thereby, the ghost light generated as a result of the deflected beam B applied outside of the effective diameter being reflected by the rib surface 9a' is bent in the sub-scan direction of the surface to be scanned 7 so that the light path of the ghost light is changed toward the outside of the effective writing range (image formation range). Accordingly, the ghost light can be prevented from being applied to the effective writing range of the surface to be scanned 7, and, thereby, any abnormal image formed by the ghost light can be prevented. That is, the ghost light does not adversely affect the proper image formation at all, and, as a result, it is possible to render a satisfactory proper image.

The above-mentioned axis along the bottom side 11 of the rib surface 9a' parallel to the optical axis of the long-dimensional lens 8 is merely an example. Alternatively, by inclining/rotating each rib surface 9a' about any axis parallel to the optical axis of the long-dimensional lens 8 by a necessary angle, it is possible to change the light path of the ghost light into an arbitrary direction.

It is also possible that each rib surface 9a' has a surface configuration such as that of a zigzag (stepwise) shape having a plurality of continuous inclined surfaces.

Figure 3B:
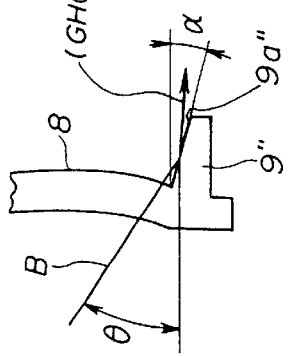
Figure 3C:
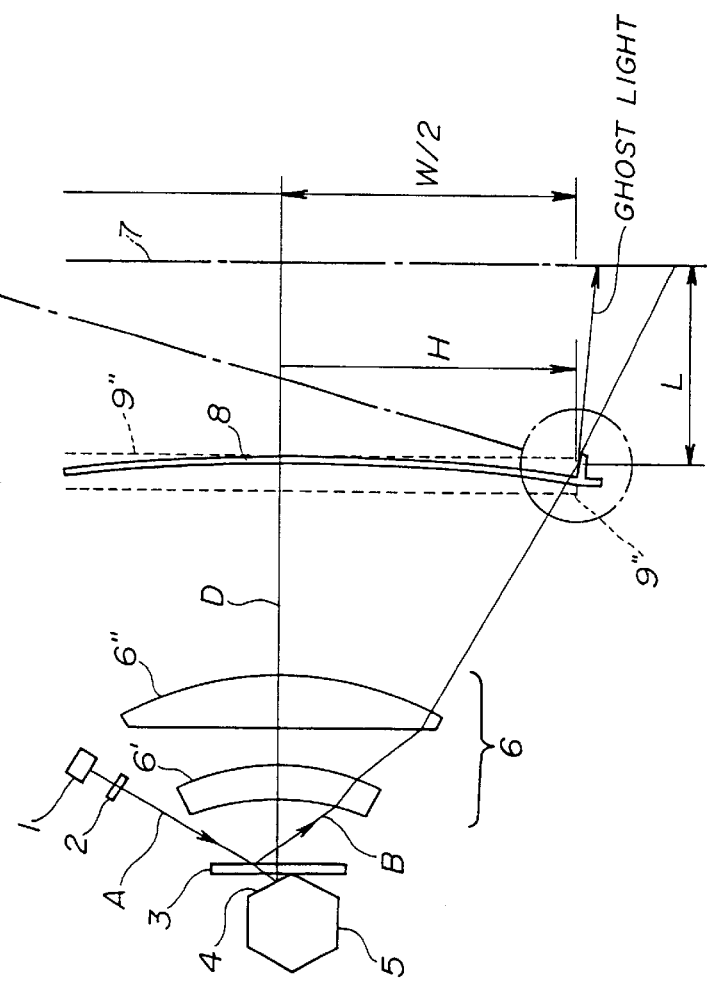

FIGS. 3A, 3B and 3C show a perspective view of an essential part of a scanning and imaging lens in a second embodiment of the present invention, a magnified view of an essential part thereof, and a plan view of an optical scanning device employing the scanning and imaging lens, respectively. In the figures, the same reference numerals are given to parts/components the same as those shown in FIGS. 1A, 1B and 1C.

In this embodiment, each rib surface $9a''$ provided at both ends in the longitudinal directions of a holding frame $9'''$ is a surface inclined/rotated so that the ghost light generated as a result of the deflected beam B being reflected by the rib surface $9a''$ is bent to the outside of the effective writing range in the main scan direction.

Figure 1B:
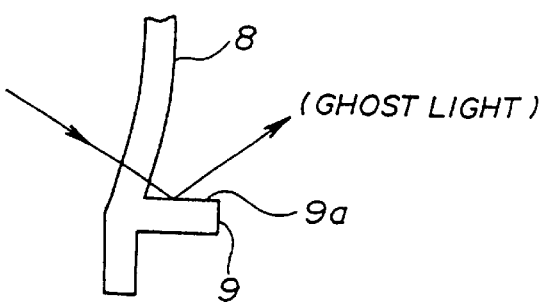

Specifically, each of the rib surfaces $9a''$ in this embodiment is a surface rotated outside by an angle α from the rib surface $9a$ in the related art shown in FIGS. 1A, 1B and 1C about an axis parallel to the sub-scan directions of the lens body 8, for example, a front vertical side 12 of the rib surface $9a$ shown in FIG. 1C.

As a result, the ghost light generated as a result of the deflected beam B applied outside of the effective diameter being reflected by the rib surface $9a''$ is bent in the main-scan direction of the surface to be scanned 7 so that the light path of the ghost light is changed toward the outside of the effective writing range (image formation range). Accordingly, the ghost light can be prevented from being applied to the effective writing range of the surface to be scanned 7, and, thereby, any abnormal image formed by the ghost light can be prevented. That is, the ghost light does not adversely affect the proper image formation at all, and, as a result, it is possible to render a satisfactory proper image.

The ghost light can be bent to the outside of the writing range as the following formula (1) holds:

$$\{H-L\times\tan(\theta-2\alpha)\}>W/2 \quad (1)$$

where, as shown in FIGS. 3B and 3C, α denotes the inclination angle of each rib surface $9a''$, θ denotes a half field angle on the rib surface $9a''$, L denotes a distance between the rib surface $9a''$ and surface to be scanned 7, H denotes a height of the rib surface $9a''$ from the optical axis, and W denotes the effective writing range on the image surface.

For example, assuming that the writing range W is 300 mm, the height of the rib surface H is 130 mm, the distance L between the rib surface and surface to be scanned 7 is 100 mm and the half field angle θ is 40°, the above-mentioned formula (1) holds when the inclination angle α in the main scan direction is set to be equal to or larger than 26°.

Figure 4A:
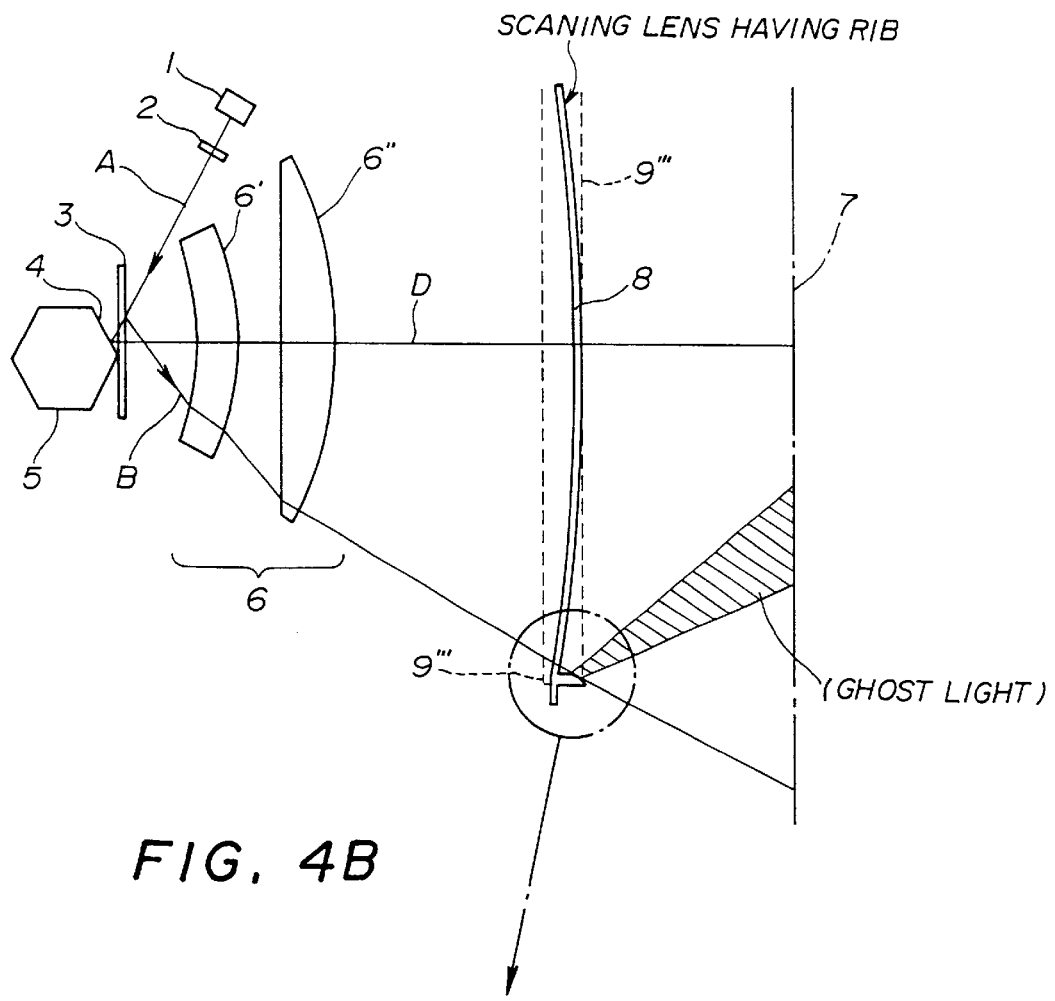
FIGS. 4A and 4B show a plan view of an optical scanning device employing a scanning and imaging lens in a third embodiment of the present invention, and a magnified view of an essential part thereof, respectively.
Figure 4B:
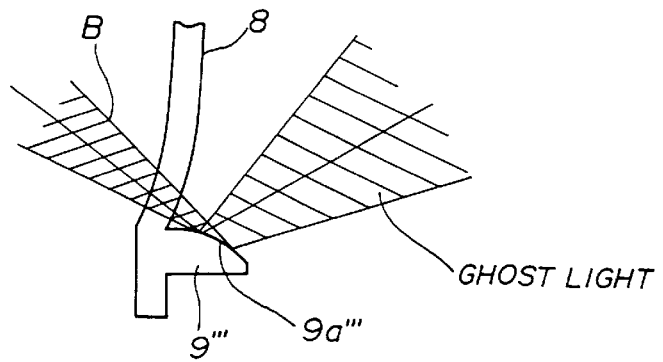

FIGS. 4A and 4B show a plan view of an optical scanning device employing a scanning and imaging lens in a third embodiment of the present invention and a magnified view of an essential part thereof, respectively.

In this embodiment, each of rib surfaces $9a'''$ provided at both ends in the longitudinal directions of a holding frame $9'''$ supporting the lens body 8 is a curved surface. Thereby, the ghost light generated as a result of the deflected beam B being reflected by the rib surface $9a'''$ is dispersed enough so as to become a beam sufficiently dispersed on the surface to be scanned 7.

A shape, a curvature and so forth of each rib surface $9a'''$ are set so that the beam spot formed on the surface to be scanned 7 from the ghost light is sufficiently large in diameter, and, thereby, the ghost light generated as a result of being reflected by the rib surface $9a'''$, even being disposed within the effective writing range of the surface to be scanned 7, does not result in exposure of the surface to be scanned 7 thereby.

When the rib surface is a plane, the ghost light generated therefrom being applied to the photosensitive body forms a beam spot having a high energy density. As a result, a clear ghost image is formed in a proper image. In contrast thereto, as the rib surface is made to be a curved surface as in the embodiment of the present invention, the ghost light generated therefrom being applied to the photosensitive body becomes a sufficiently dispersed beam forming a beam spot having a low energy density. Thereby, the photosensitive body is not exposed thereby, and, as a result, it is possible to form a sufficient proper image.

When the curved surface of each rib surface $9a'''$ is either a concave surface or a convex surface, similar effect can be obtained therefrom.

In each of the above-described first, second and third embodiments, as the material of the scanning and imaging lens is plastic material, and the lens body thereof and holding frame are molded integrally, the ghost light generated from the rib surface does not adversely affect the proper image formation. Thereby, it is possible to achieve an inexpensive, and high-rigidity scanning optical system.

Figure 5:
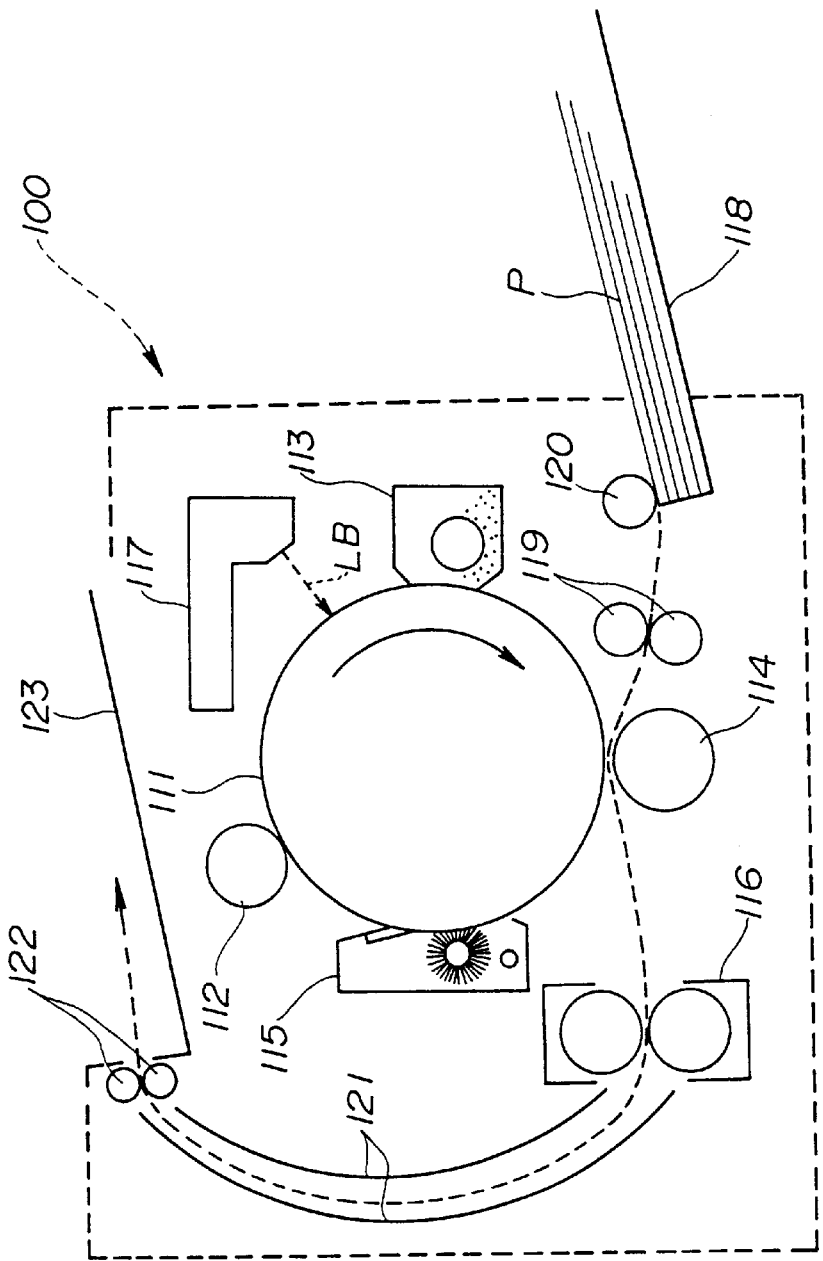
FIG. 5 shows a general sectional view of an image forming apparatus in a fifth embodiment of the present invention employing the optical scanning device in any of the first, second and third embodiments of the present invention.

With reference to FIG. 5, an image forming apparatus in a fourth embodiment of the present invention will now be described.

The image forming apparatus shown in FIG. 5 is a laser printer, for example.

This laser printer 100 has a cylindrical photoconductive photosensitive body acting as a photosensitive medium 111. In the periphery of the photosensitive medium 111, a charging roller 112 acting as a charging unit, a developing device 113, a transfer roller 114, and a cleaning device 115 are disposed. It is also possible to use a well-known corona charger as the charging unit.

Further, an optical scanning device 117 using a laser beam LB is provided, and performs exposure through optical writing between the charging roller 112 and developing device 113.

As shown in FIG. 5, a fixing device 116, a cassette 118, a pair of registration rollers 119, a paper feeding roller 120, a conveying path 121, a pair of paper ejecting rollers 122, and a tray 123 are also provided. Transfer paper P is used as a sheet-type recording medium.

When image formation is performed, the photosensitive medium 111 is rotated clockwise at a uniform velocity, the surface thereof is charged uniformly by the charging roller 112, and an electrostatic latent image is formed on the surface (surface to be scanned) of the photosensitive medium 111 through exposure by optical writing with the laser beam LB of the optical scanning device 117. The thus-formed electrostatic latent image is a so-called negative latent image having an image part exposed thereby.

This electrostatic latent image is developed inversely by the developing device 113, and, thus, a toner image is formed on the photosensitive medium 111.

The cassette 118 containing the transfer paper P is detachable from/to the body of the image forming apparatus 100. In the state in which the cassette 118 is loaded as shown in the figure, the top one sheet of the transfer paper P is fed by the paper feeding roller 120. The thus-fed transfer paper P is nipped by the pair of registration rollers 119 at the top of the paper P. The pair of registration rollers 119 feed the transfer paper P to a transfer position of the photosensitive medium 111 at the time at which the toner image is moved to the transfer position. The fed transfer paper P is laid onto the toner image at the transfer position, and, by the function of the transfer roller 114, the toner image is transferred to the transfer paper P electrostatically.

The transfer paper P thus having had the toner image transferred thereto is sent to the fixing device 116, which fixes the toner image onto the transfer paper P. Then, the transfer paper P passes through the conveying path 121, and is ejected to the tray 123 by the pair of ejecting rollers 122. The surface of the photosensitive medium 111 is then cleaned by the cleaning device 115, and, thus, remaining toner, paper powder and so forth are removed therefrom.

It is also possible to use an OHP sheet instead of the above-mentioned transfer paper. A provision may be made such that the transfer of the toner image is performed via an intermediate transfer medium such as an intermediate transfer belt or the like.

By employing the optical scanning device including the scanning and imaging lens such as that in any of the first, second and third embodiments of the present invention shown in FIGS. 2, 3A–3C and 4A–4B, as the optical scanning device 117 of the above-described image forming apparatus in the fourth embodiment of the present invention shown in FIG. 5, it is possible to render satisfactory proper image formation.

The present invention is not limited to the above-described embodiments, and variations and modifications may be made without departing from the scope of the present invention.

The present application is based on Japanese priority application No. 2000-087394, filed on Mar. 27, 2000, the entire contents of which are hereby incorporated by reference.

What is claimed is:

1. An optical scanning device comprising:

a scanning and imaging lens configured to condense a beam deflected by a light deflector toward a surface to be scanned to form a beam spot thereon; and a holding frame configured to hold a lens body of at least one lens included in the scanning and imaging lens, wherein a rib surface at an end in a longitudinal direction of the holding frame is inclined so that a ghost light generated as a result of the deflected beam being reflected by the end in the longitudinal direction of the holding frame is changed in light path in a sub-scan direction.

2. The device as claimed in claim 1, wherein said rib surface is inclined as a result of being rotated about an axis parallel to an optical axis of said lens body.

3. The device as claimed in claim 1, wherein said lens body and holding frame are manufactured through integral molding of a plastic material.

4. An image forming apparatus comprising:

photosensitive medium having a photosensitive surface;

an optical scanning device including a scanning and imaging lens configured to condense a beam deflected by a light deflector toward a surface to be scanned as the photosensitive surface to form a beam spot thereon so as to perform optical scanning of the photosensitive surface of the photosensitive medium to form a latent image;

a developing unit configured to develop the latent image; and a holding frame configured to hold a lens body of at least one lens included in the scanning and imaging lens, wherein a rib surface at an end in a longitudinal direction of the holding frame is inclined so that a ghost light generated as a result of the deflected beam being reflected by the end in the longitudinal direction of the holding frame is changed in light path in a sub-scan direction.

5. An optical scanning method comprising:

condensing a beam deflected by a light deflector toward a photosensitive surface of a photosensitive medium via an optical scanning device including a scanning and imaging lens;

optically scanning the photosensitive surface of the photosensitive medium so as to form a latent image; and developing the latent image, wherein a lens body of at least one lens included in the scanning and imaging lens is held by a holding frame, wherein a rib surface at an end in a longitudinal direction of the holding frame is inclined so that a ghost light generated as a result of the deflected beam being reflected by the end in the longitudinal direction of the holding frame is changed in light path in a sub-scan direction.

6. An optical scanning device comprising:

scanning and imaging means for condensing a beam deflected by a light defecting means toward a surface to be scanned to form a beam spot thereon; and holding frame means for holding a lens body of at least one lens included in the scanning and imaging means, wherein a rib surface at an end in a longitudinal direction of the holding frame means is inclined so that a ghost light generated as a result of the deflected beam being reflected by the end in the longitudinal direction of the holding frame means is changed in light path in a sub-scan direction.

* * * * *